US007092189B2

(12) United States Patent
Kuehlwein

(10) Patent No.: US 7,092,189 B2
(45) Date of Patent: Aug. 15, 2006

(54) PROGRAMMABLE OUTPUT IMPEDANCE FOR HARD DRIVE PREAMPLIFIER WRITE DRIVER

(75) Inventor: Jeremy Robert Kuehlwein, Woodbury, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/973,845

(22) Filed: Oct. 26, 2004

(65) Prior Publication Data

US 2006/0087761 A1    Apr. 27, 2006

(51) Int. Cl.
*G11B 5/02* (2006.01)

(52) U.S. Cl. ...................................................... 360/68

(58) Field of Classification Search ...................... None
See application file for complete search history.

(56) References Cited

U.S. PATENT DOCUMENTS

| | | | |
|---|---|---|---|
| 6,084,378 A * | 7/2000 | Carobolante | 318/811 |
| 6,487,034 B1 * | 11/2002 | Jiang et al. | 360/68 |
| 6,549,044 B1 * | 4/2003 | Brambilla et al. | 327/110 |
| 6,621,469 B1 * | 9/2003 | Judd et al. | 343/853 |

* cited by examiner

*Primary Examiner*—Wayne Young
*Assistant Examiner*—Glenda P. Rodriguez
(74) *Attorney, Agent, or Firm*—W. James Brady, III; Frederick J. Telecky, Jr.

(57) ABSTRACT

A write driver output circuit having a programmable output impedance. A plurality of amplifiers are disposed in parallel between an input and an output of an impedance matching section of the write driver circuit and can be selectively enabled to correspondingly set the output impedance of the write driver circuit. The amplifiers may be Class AB amplifiers, each of which have a smaller size than an conventional AB used in a single amplifier write driver circuit. Each of the Class AB amplifiers has a corresponding matching resistor, and a current source, each being selectively enabled and disabled by enabling and disabling, respectively, the corresponding current sources, such as through the use of serial interface bits.

11 Claims, 2 Drawing Sheets

PROGRAMMABLE OUTPUT IMPEDANCE FOR HARD DRIVE PREAMPLIFIER WRITE DRIVER

FIELD OF THE INVENTION

The present invention is generally related to hard disk drive preamplifier write driver circuits.

BACKGROUND OF THE INVENTION

Hard disk drives are mass storage devices that include a magnetic storage media, e.g. rotating disks or platters, a spindle motor, read/write heads, an actuator, a pre-amplifier, a read channel, a write channel, a servo circuit, and control circuitry to control the operation of hard disk drive and to properly interface the hard disk drive to a host system or bus. FIG. 1 shows an example of a prior art disk drive mass storage system 10. Disk drive system 10 interfaces with and exchanges data with a host 32 during read and write operations. Disk drive system 40 includes a number of rotating platters 12 mounted on a base 14. The platters 12 are used to store data that is represented as magnetic transitions on the magnetic platters, with each platter 12 coupleable to a head 16 which transfers data to and from a preamplifier 26. The preamp 26 is coupled to a synchronously sampled data (SSD) channel 28 comprising a read channel and a write channel, and a control circuit 30. SSD channel 28 and control circuit 30 are used to process data being read from and written to platters 12, and to control the various operations of disk drive mass storage system 10. Host 32 exchanges digital data with control circuit 30.

Data is stored and retrieved from each side of the magnetic platters 12 by the arm and interconnect 16 which comprise a read head 18 and a write head 20 at the tip thereof. The conventional read head 18 and write head 20 comprise magneto-resistive read head and thin-film inductive write head adapted to read or write data from/to platters 12 when current is passed through them. Arm and interconnect 16 are coupled to preamplifier 26 that serves as an interface between read/write heads 18/20 of disk/head assembly 10 and SSD channel 28. The preamp 26 provides amplification to the waveform data signals as needed for both read and write operations. A preamp 26 may comprise a single chip or may comprise separate components rather than residing on a single chip.

The magnetic flux transitions on the magnetic platter 42 are created by switching the write current polarity through the write head 20. The faster the write current switches polarity, the faster the change of the magnetic flux, and consequently more bits per inch can be stored in the media. To decrease the transition time of the media, an overshoot current is employed with the write driver signal.

To achieve the best high-speed performance in a preamplifier system, impedance matching techniques much be employed. One aspect of this is that the output impedance of the preamplifier write driver must match the interconnect which it drives. Currently, this may be done by customizing the write driver output impedance for each customer application since each application has its own unique interconnect characteristics. With an established write driver, this may be the only change between different applications. Furthermore, the interconnect may change during the lifetime of a customer application.

It would be very desirable and beneficial to have a write driver output impedance that can be programmable through the serial interface. This would save engineering work, reduce silicon tape-outs, mask costs, and increase chances of success in a customer application.

SUMMARY OF THE INVENTION

The present invention achieves technical advantages as a write driver circuit having a programmable output impedance. A plurality of low output impedance amplifiers and associated matching resistors disposed in parallel between an input and an output of the impedance match section of the write driver circuit can be selectively enabled to correspondingly set the output impedance of the write driver circuit.

In one preferred embodiment, each of the amplifiers may be a Class AB amplifier, each of which have a smaller size than an conventional AB used in a single amplifier impedance match section of the driver circuit. Each of the Class AB amplifiers has a corresponding matching resistor, and current sources. Each of the programmable amplifiers are selectively enabled and disabled by enabling and disabling, respectively, the corresponding current sources. Each of these programmable amplifiers may be enabled and disabled through the use of serial interface bits.

DETAILED DESCRIPTION OF THE PREFERRED EMBODIMENT

Figure 1:
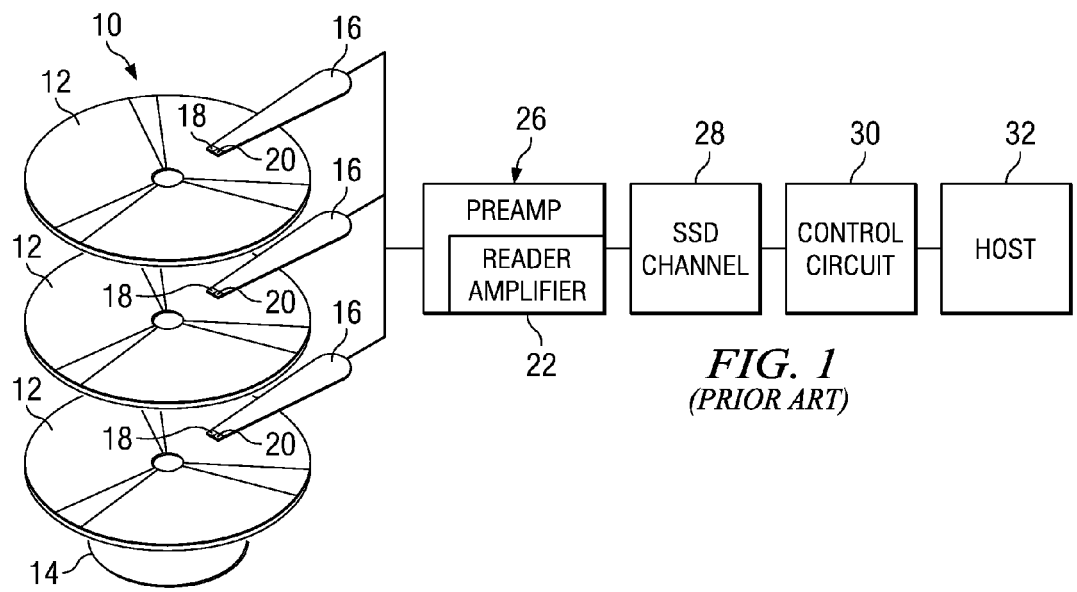
FIG. 1 is a schematic of a conventional hard disk drive system.
Figure 2:
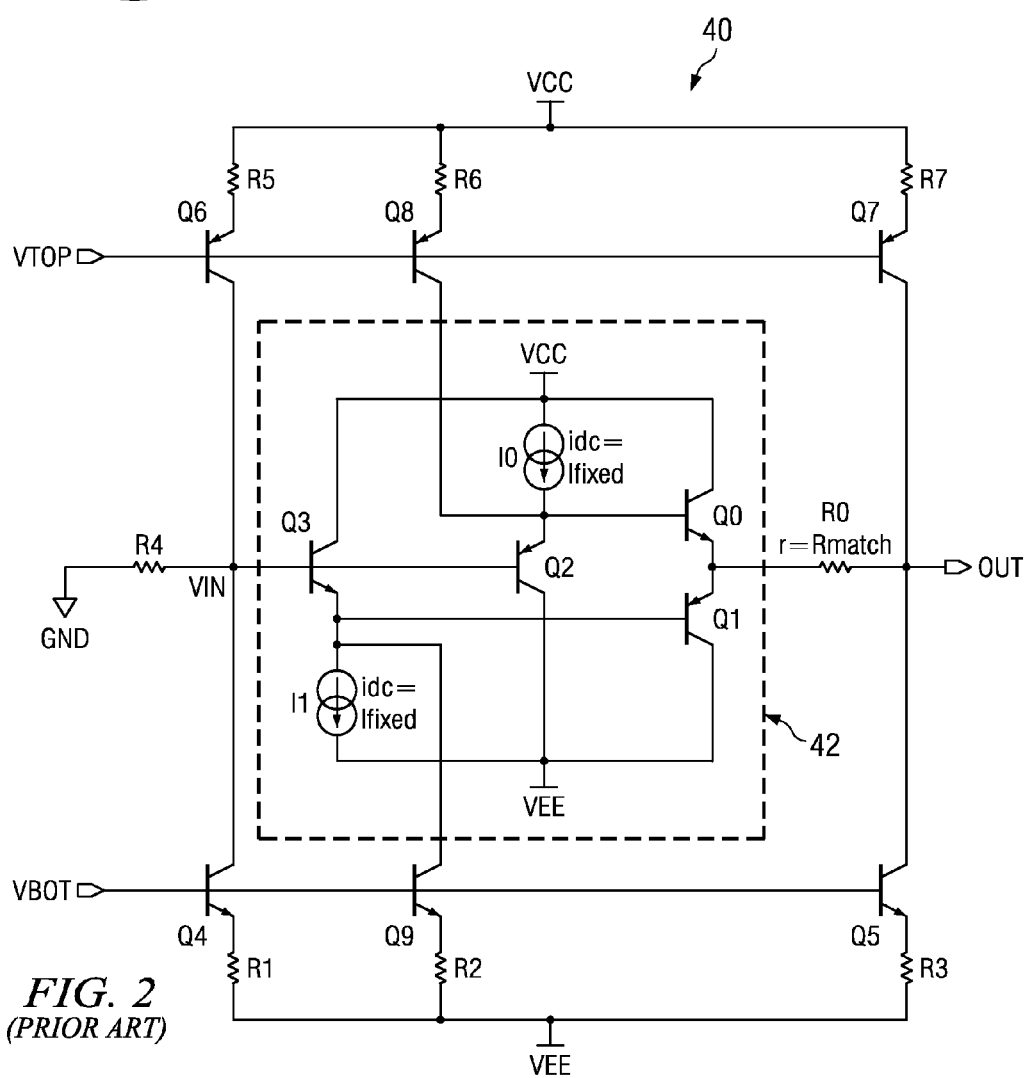
FIG. 2 is an electrical schematic view of half a H-bridge write driver circuit.

FIG. 2, depicts at 40 a simplified output impedance circuit of half-cell of a H-bridge write driver circuit. Looking into the output node OUT, the output impedance is a fixed value, and is approximately Rmatch+(re0//re1). The collectors of transistors Q7 and Q5 are high impedance and do not factor into the output impedance. The total differential output impedance of the complete H-bridge circuit is twice that looking into the OUT node. Transistors Q0–Q3, and current sources I0 and I1, together comprise an AB driver 42 which provide a low impedance to drive the match resistor R0. Transistors Q8 and Q9, resistors R6 and R2 are additional current sources for transistors Q2 and Q3.

Figure 3:
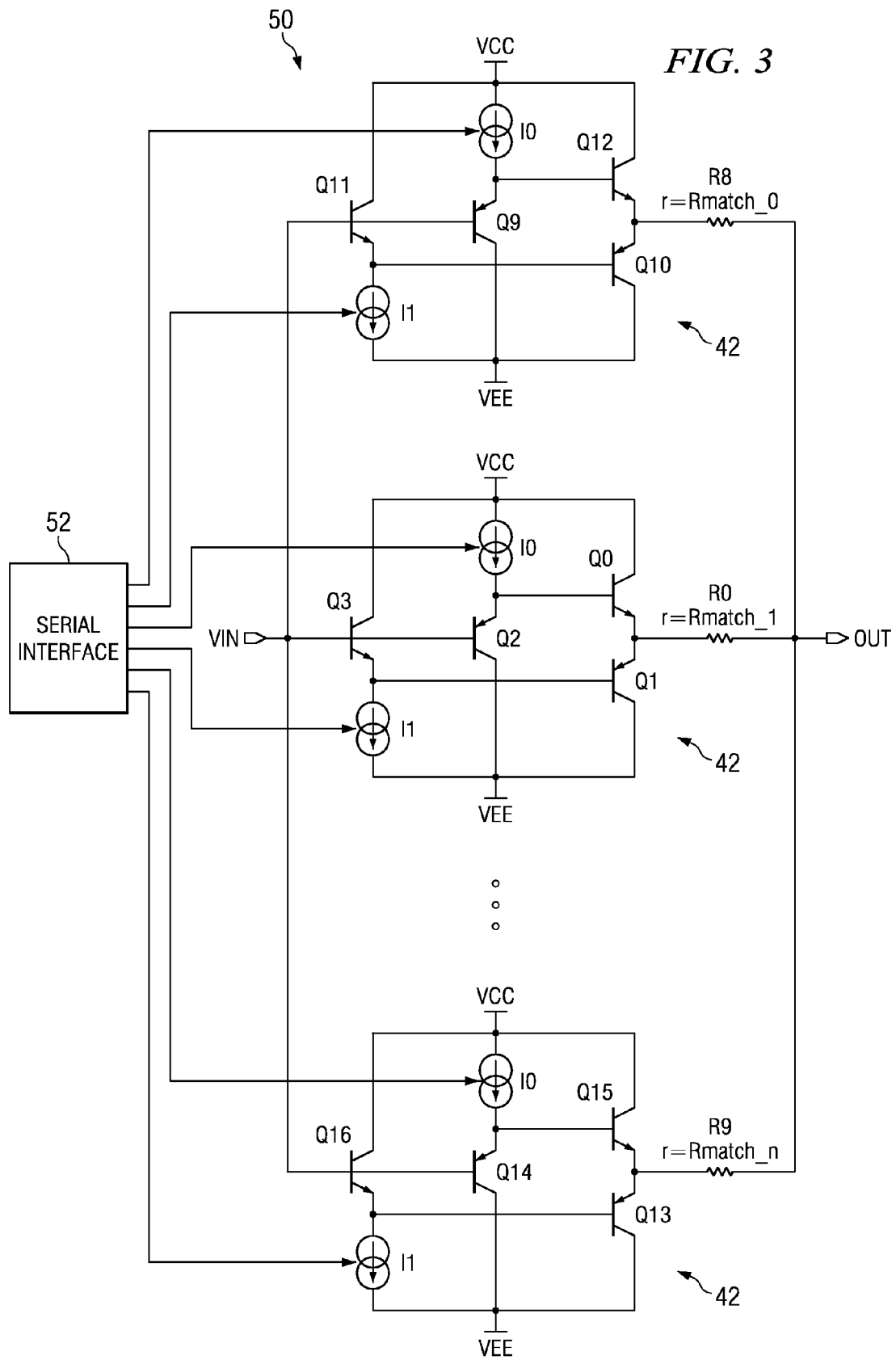
FIG. 3 is an electrical schematic of the present invention.

Referring now to FIG. 3, the AB driver 42, including current sources I0 and I1, transistors Q0–Q3, and the associated driven match resistor RO that it drives, has been reproduced an arbitrary number of times N as shown at 50. This embodiment of the invention could have as few as 2 AB drivers (N=2) (each driver 42 with a corresponding match resistor), and as many as desired or practical. The other devices shown in FIG. 2 have been omitted from this Figure for simplicity. Advantageously, by having multiple AB drivers 42 and associated match resistors in parallel between the circuit input and output, the output impedance seen at output node OUT can be made programmable by turning on and off various combinations of the AB drivers 42. Turning on and off each AB driver 42 is accomplished by turning on and off its associated current source Iprog through the use of serial interface bits.

When respective current sources I0 and I1 are off, that associated AB driver 42 will be off and present a high impedance looking into the emitters of its output devices. This high impedance is in series with its match resistor which is tied to the output node OUT. This high impedance will have no effect on the total output impedance seen at output node OUT.

When current sources I0 and I1 are on, that respective AB driver 42 will be on and present a low impedance (re0//re1) looking into the emitters of its output devices. This low impedance is in series with its match resistor, which gives an impedance of Rmatch+(re0//re1) that is tied to the output node OUT. The overall output impedance of circuit 50 is the parallel combination of the enabled AB driver stages 42 (and corresponding resistors) that are turned on. The maximum output impedance seen at output node OUT is set by leaving one AB driver 42 (and resistor) always on, and which AB driver is not programmable. The minimum output impedance seen at output node OUT is the parallel combination when all the AB drivers 42 are turned on.

The manner in which the Rmatch resistors for each AB driver 42 are set is arbitrary. The Rmatch resistors can be scaled in binary fashion, linear fashion, or in any other way desired.

There are many methods in which the current sources I0 and I1 of AB drivers 42 can be turned on and off in a programmable fashion through a serial interface 52. Possible methods include switching MOS devices in the base/gate, emitter/source, or drain of a current mirror output device.

Depending on silicon process, there may be breakdown concerns with devices in the off AB drivers 42. A possible solution to this concern is placing a large resistor across the emitter-base junction of each AB driver 42 output device to maintain control over the voltage at each output device base.

Silicon area will be slightly larger with the circuit 50. While this circuit 50 has multiple AB drivers 42, each driver 42 can be physically smaller than the AB driver shown in FIG. 2 when only one AB driver is available. This is because each AB driver 42 in circuit 50 has a higher individual output impedance than the single AB driver 42 of FIG. 2, and each driver 42 of circuit 50 will have less current to handle. Thus, using multiple smaller drivers 42 in circuit 50 allows smaller overall device sizing.

Note that the manner in which the match resistors are set will affect this. When multiple AB drivers 42 are turned on and the total output impedance of circuit 50 is reduced, the resultant larger current is divided in parallel amongst the multiple AB drivers 12. There will be silicon area overhead in the additional metal routing and less efficient device layout due to separate isolation of the smaller devices 42.

The present invention derives technical advantages as a write driver operable between −5V and +5V without any device breakdown occurring.

In an alternative embodiment of the invention, for a write driver operating from 0 v to 5 v, a programmable output impedance can also be achieved through the use of several parallel branches of MOS devices in series with match resistors. For high performance writer drivers that operate between −5 v to +5 v, such as circuit 50, this high voltage would break down the MOS devices and thus prohibits the use of MOS devices in this circuitry 50.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A hard disk drive write circuit having an output impedance, comprising:
   an H-bridge write driver circuit including an impedance matching circuit having an input and an output; and
   a plurality of amplifiers coupled in parallel between the input and output, wherein several of the amplifiers are adapted to be selectively enabled and disabled,
   wherein at least one of the amplifiers is always on and is not programmable.

2. The hard disk drive write circuit as specified in claim 1 wherein the selective enabling and disabling of the amplifiers correspondingly varies the output impedance of the write driver circuit.

3. The hard disk drive write circuit as specified in claim 2 wherein the selective enabling of the amplifiers reduces the output impedance of the write driver circuit.

4. The hard disk drive write circuit as specified in claim 3 wherein the selective enabling of the amplifiers increases a drive current of the write drive circuit.

5. The hard disk drive write circuit as specified in claim 4 wherein several of the amplifiers comprise Class AB amplifiers.

6. The hard disk drive write circuit as specified in claim 1 wherein each amplifier has a current source, wherein the amplifiers are enabled and disabled by turning on and off, respectively, the respective current source.

7. The hard disk drive write circuit as specified in claim 6 wherein each amplifier has a plurality of current sources respectively enabled and disabled.

8. The hard disk drive write circuit as specified in claim 1 wherein the plurality of amplifiers have a high output impedance when disabled.

9. The hard disk drive write circuit as specified in claim 1 wherein each amplifier has a corresponding output matching resistor.

10. A hard disk drive write circuit having an output impedance, comprising:
    an H-bridge write driver circuit including an impedance matching circuit having an input and an output; and
    a plurality of amplifiers coupled in parallel between the input and output, wherein several of the amplifiers are adapted to be selectively enabled and disabled,
    wherein each amplifier has a current source, wherein the amplifiers are enabled and disabled by turning on and off, respectively, the respective current source,
    wherein each programmable amplifier current source is adapted to be turned on and off using serial interface bits.

11. A hard disk drive write circuit having an output impedance, comprising:
    an H-bridge write driver circuit including an impedance matching circuit having an input and an output; and
    a plurality of amplifiers coupled in parallel between the input and output, wherein several of the amplifiers are adapted to be selectively enabled and disabled,
    wherein each amplifier has a current source, wherein the amplifiers are enabled and disabled by turning on and off, respectively, the respective current source,
    wherein each amplifier has a plurality of current sources respectively enabled and disabled, and
    wherein each programmable amplifier current source is adapted to be turned on and off using serial interface bits.

* * * * *